United States Patent
Chang

(10) Patent No.: US 6,547,647 B2
(45) Date of Patent: Apr. 15, 2003

(54) METHOD OF WAFER RECLAIM

(75) Inventor: Ching-Yu Chang, I-Lan (TW)

(73) Assignee: Macronix International Co., Ltd. (TW)

( * ) Notice: Subject to any disclaimer, the term of this patent is extended or adjusted under 35 U.S.C. 154(b) by 24 days.

(21) Appl. No.: 09/823,994

(22) Filed: Apr. 3, 2001

(65) Prior Publication Data

US 2002/0173115 A1 Nov. 21, 2002

(51) Int. Cl.$^7$ ................................................ B24B 1/00
(52) U.S. Cl. .......................... 451/41; 451/36; 451/37; 451/54; 156/345.12
(58) Field of Search ........................ 451/41, 36, 37, 451/285, 287, 288, 54; 134/10, 100, 110, 111, 902; 156/345.12, 345.11, 626, 627; 438/691, 692

(56) References Cited

U.S. PATENT DOCUMENTS

| | | | | |
|---|---|---|---|---|
| 5,827,781 A | * | 10/1998 | Skrovan et al. | 438/692 |
| 5,855,735 A | * | 1/1999 | Takada et al. | 156/636.1 |
| 6,046,108 A | * | 4/2000 | Liu et al. | 438/687 |
| 6,302,766 B1 | * | 10/2001 | Sethuraman et al. | 451/41 |
| 6,319,330 B1 | * | 11/2001 | Jiang et al. | 134/2 |
| 6,332,835 B1 | * | 12/2001 | Nishimura et al. | 451/67 |

* cited by examiner

Primary Examiner—Eileen P. Morgan

(57) ABSTRACT

A method of wafer reclaim, at least includes: provide a wafer; perform a first semiconductor process to let both film layer and numerous particles are formed on the wafer; perform chemical mechanical polishing process to let part of film layer is removed and scales of part of particles are decreased; perform wet etching process to let both residual film layer and residual particles are further removed; perform cleaning process to let surface of wafer is cleaned; and perform second semiconductor process to let a semiconductor structure is formed on wafer. Furthermore, concepts of the invention that both film layer and particles are thoroughly removed by both chemical mechanical polishing process and wet etching process can be applied as a method for cleaning wafer and a method for planarizing wafer.

16 Claims, 7 Drawing Sheets

METHOD OF WAFER RECLAIM

BACKGROUND OF THE INVENTION

1. Field of the Invention

This invention relates generally to a method of wafer reclaim, further relates to a method for cleaning wafer and a method for planarizing wafer.

2. Description of the Prior Art

In practical semiconductor fabrication, owing to numerous processing steps are performed before a wafer is changed into numerous integrated circuits, the wafer will be failed whenever any processing step is out of order such that actual action on the wafer is different from the predetermined action. Thus, in practical semiconductor fabrication, after parameter(s) of any processing step is set up, in most of case, monitor wafer is processed by the processing step to examine whether the set sup parameter(s) is proper. Then, practical wafers are processed by the tested processing process only while the actual action on the monitor is equal to the predetermined action which decided by the set up parameter(s). For example, before depositing process is performed, in order to ensure thickness and uniformity of deposited film match the desired limitation and pollution induced by particles which are formed during perform of depositing process is acceptable, depositing process is performed to form film on monitor wafer to ensure all requirements and then depositing process is performed to form file(s) on practical wafers when all requirements is satisfied.

Because that cost of each monitor wafer is not low, monitor wafer(s) is repeatedly used in practical semiconductor fabrication to reduce total cost. In other words, after each application, condition of used monitor wafer must be restored to the original condition before monitor wafer is used, to ensure monitor wafer is tested in different cases with same condition. For conventional technologies, after monitor wafer is used, etching process, such as wet etching process, is used to remove action and result, such as film, of monitor processing process and then surface of monitor wafer is cleaned by a cleaning process.

However, conventional technologies do not always can thoroughly restore original condition of monitor wafer. As FIG. 1A shows, some processing processes form both thin film 11 and random distributing particles 12 on monitor wafer 10, where particles 12 usually are by-products of tested processing process and thin film 11 may be not uniform. Obviously, after etching process is completed, the existence of particles 12 as well as the even roughness of thin film 11 and by-product of etching process will induce the existence of residual particles 13, as FIG. 1B show. Thus, because plural available sources of residual particles 13 let residual particles 13 have plural materials, also because cleaning process usually aims at pollution, small particle, and by-products of etching process, cleaning process usually can not thoroughly remove all residual particles 13 and then some defects 14 will appear on surface of monitor wafer 10 after the reclaim process, as FIG. 1C shows, wherein defects 14 is not appeared on the original condition of monitor wafer 10. Certainly, some of the defects 14 perhaps are effectively removed by increasing period of cleaning process or modifying reactant(s) of cleaning process, but disadvantages such as increased cost and decreased efficiency are unavoidable. Without question, defects 14 will induce error messages whenever monitor wafer 10 is used to monitor any processing step again. FIG. 1D shows that thin film 11 and particles 12 are formed on normal monitor wafer 10 without defect, FIG. 1E shows that thin film 11 and particles 12 are formed on monitor wafer 10 with existence of defects 14. By comparing FIG. 1D with FIG. 1E, it is clear that particle-like structure, which usually called as pseudo particle 15, will appear over defect 14 whenever evenness of thin film 11 is affected by existence of defects 14. Significantly, if scale of any pseudo particle 15 is larger than lower limitation of detectable scale of testing process which is used to detect particles on monitor wafer 10, counted number of particles of FIG. 1D is different from counted number of particles of FIG. 1E, and the difference is not induced by error of testing process but is induced by abnormal qualify of monitor wafer 10. Therefore, existence of pseudo particles 10 will let reclaimed monitor wafer(s) 10 can not properly used for process monitoring.

Accordingly, because conventional technologies can not ensure monitor wafer is properly restored after each application, and because existence of defects on monitor wafer will be amplified and induce existence of pseudo particles, it is desired to develop a method for reducing or totally eliminate effect of pseudo particles.

SUMMARY OF THE INVENTION

One main object of the invention is to reduce or even eliminate the effect of pseudo particles during wafer reclaim, such as monitor wafer.

Another object of the invention is to present a method for cleaning wafer. Where numerous particles usually exist on surface of wafer or covered by deposition film.

Still an essential object of the invention is to present a method for planarizing wafer, wherein the method uses both chemical mechanical polishing and wet etching.

Further, another main object of the invention is to present a method for effectively removing all residuals of performed process, such as particles, residual particles and defects, with the advantage of simple processing conditions.

Yet a main object of the invention is to present a method of wafer reclaim with the advantages of both low cost and high efficiencies, especially is to present a method for different kind of film removed.

According to previous objects, this invention present a method of wafer reclaim, the method at least includes following steps: provide a wafer; perform a first semiconductor process to let both a thin film layer and numerous particles are formed on the wafer; perform a chemical mechanical polishing process to let part of the thin film layer is removed and most part of the particles are planarized; perform a wet etching process to further remove both residual thin film layer and residual particles; perform a cleaning process to clean surface of wafer; and perform second semiconductor process to let a semiconductor structure is formed on wafer. Where, particles usually are by-products of first semiconductor process and it is hard to remove particles by wet etching process or cleaning process, and particles usually are not thoroughly covered by thin film layer. Furthermore, concepts of the invention that both deposition film layer and particles can be thoroughly removed by both chemical mechanical polishing process and wet etching process, which therefore can be applied as a method for cleaning wafer and a method for removing particles.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

Some preferred embodiments are discussed in detail below, and are used to clearly explain this invention. However, it should be emphasized that this claimed invention can be applied to much application and are not limited by these embodiments. Therefore, available range of this invention is not limited by present embodiments but is limited by claims.

The Essential concept of this invention is to reclaim wafer by combination of chemical mechanical polishing process and wet etching process. Conventional technology only use wet etching such that particles are not thoroughly removed, this invention extra use chemical mechanical polishing to enhance removal of particles; but owing to etching rate of chemical mechanical polishing is limited and stop layer is required to control removed amount, this invention still uses wet etching to remove thin film and particles, and to ensure efficiency and protect wafer.

Figure 1A:
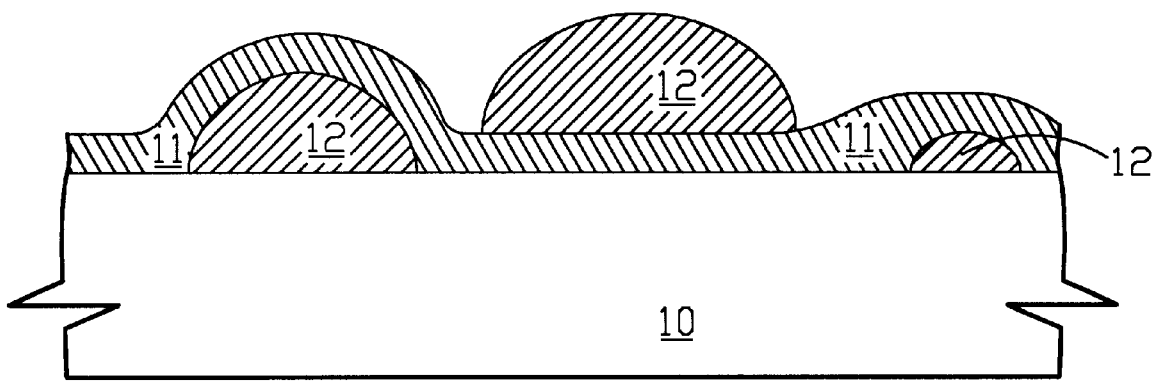
FIG. 1A through FIG. 1E are some cross-sectional illustrations about basic steps of conventional technologies for restoring condition of monitor wafer.
Figure 2A:
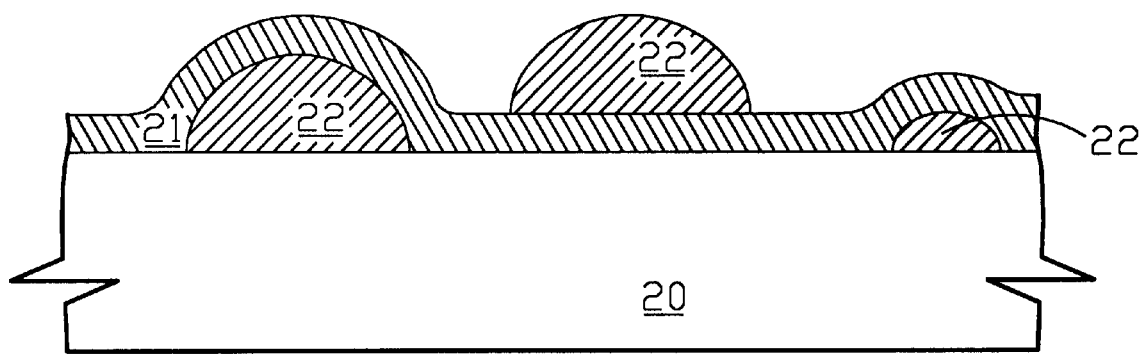
FIG. 2A through FIG. 2E are some cross-sectional illustrations about basic steps of this present invention for restoring condition of monitor wafer.
Figure 2B:
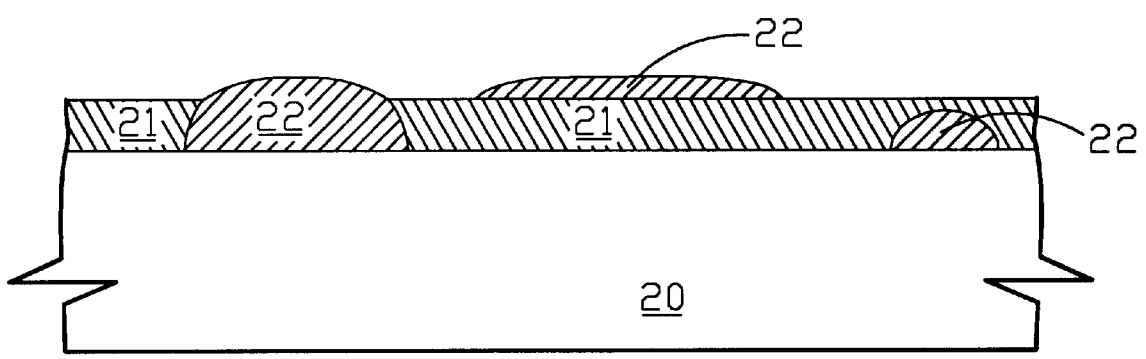
Figure 2C:
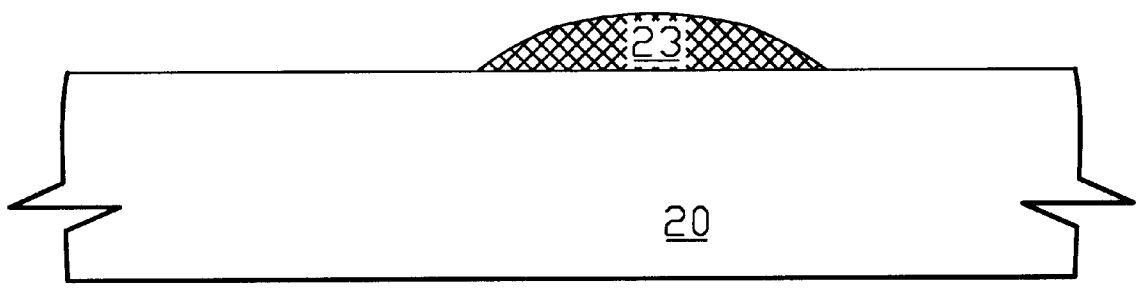
Figure 2D:
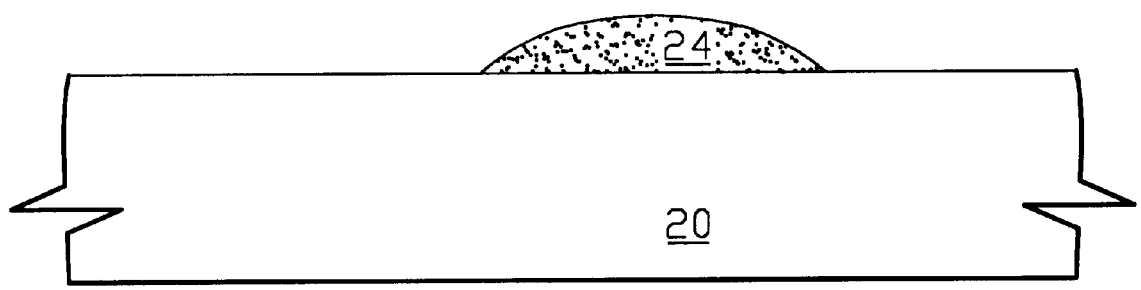

Basic mechanism of this invention is disclosed as following: monitor wafer 20 is used to monitor one semiconductor process and then both deposition layer 21 and numerous particles 22 exist on surface of monitor wafer 20, as FIG. 2A shows which is similar to the case shown in FIG. 1A, where particles 22 usually randomly distribute over monitor wafer 20. Next, chemical mechanical polishing process is used to remove part of film layer 21 and reduce scale of part of particles 22, especially particles 22 were not totally covered by film layer 21, as FIG. 2B shows. Then, wet etching process is used to remove residual film layer 21 and particles 22 until film layer 21 is thoroughly removed, as FIG. 2C shows, where some residual particles 23 induced by factors such as effect of particles 22 and by-products of wet etching process are appeared. Finally, cleaning process is used to clean surface of monitor wafer 20. Where, because plural sources of residual particles 23 induces residual particles 23 have plural materials and because wet process usually is used to remove pollution and by-products of wet etching process, it is possible that defects 24, exist on surface of monitor wafer 20, as FIG. 2D shows.

Figure 1B:
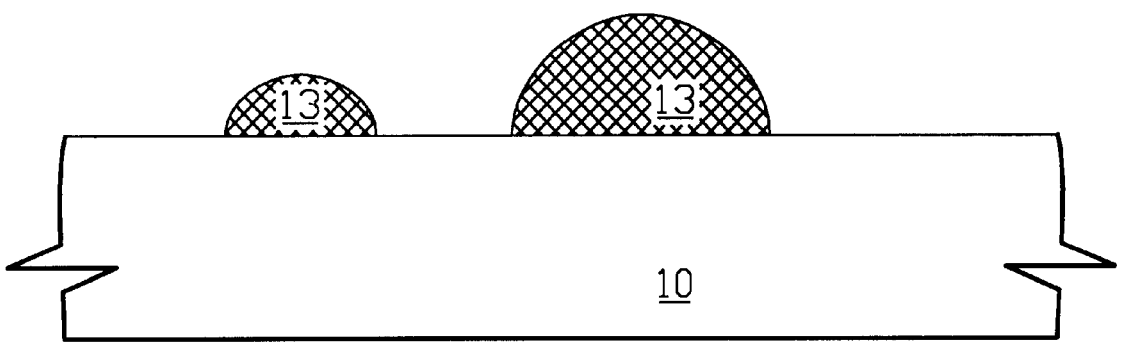
Figure 1C:
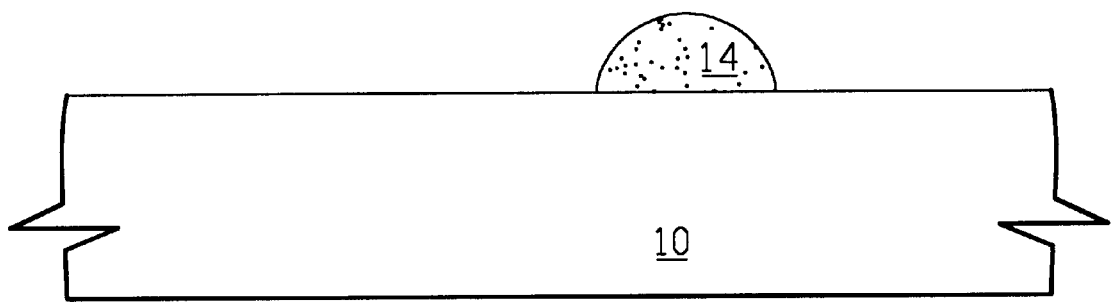
Figure 1D:
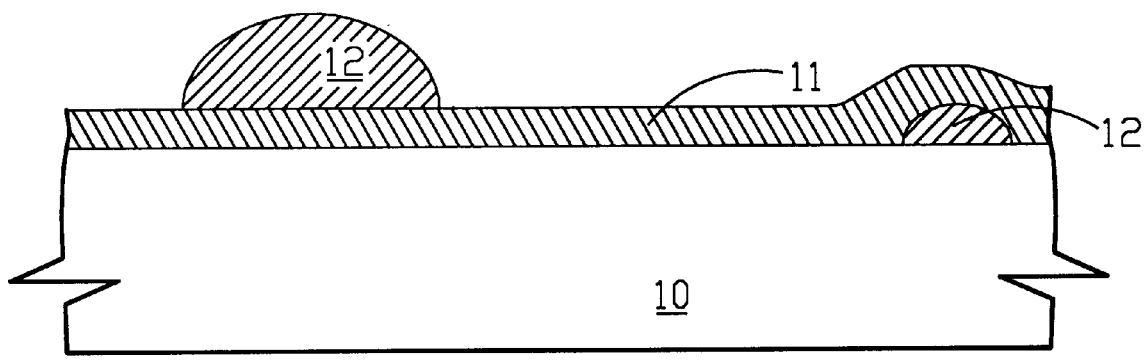

Significantly, by comparing FIG. 2A to FIG. 2D with FIG. 1A to FIG. 1D, especially by comparing FIG. 2B and FIG. 2C with FIG. 1B, it is obvious that scale of particles 22 is effectively decreased in this invention by application of chemical mechanical polishing, especially part of particles 22 that are not covered by film layer 21. Thus, after both wet etching process and cleaning process are performed, scale of defects 24 that induced by particles 22 of this invention will be smaller than scale of defects by conventional technologies. Moreover, by comparing FIG. 2B to FIG. 2D with FIG. 1B to FIG. 1C, one of main advantages of this invention is particularly obvious: this invention can more effectively remove uncovered part of each particle 22, where uncover part means does not covered by film layer 21 and more effectively decreased height of each particle 22.

Figure 1E:
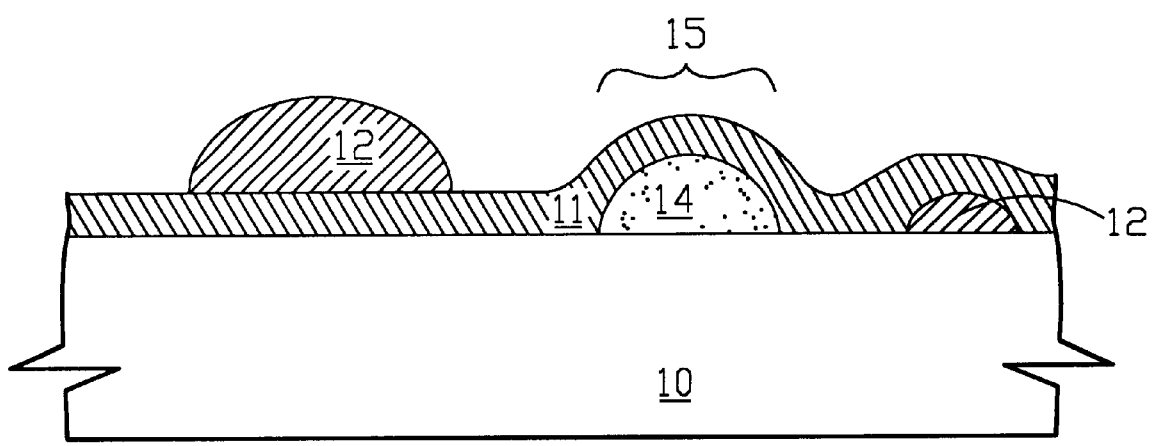
Figure 2E:
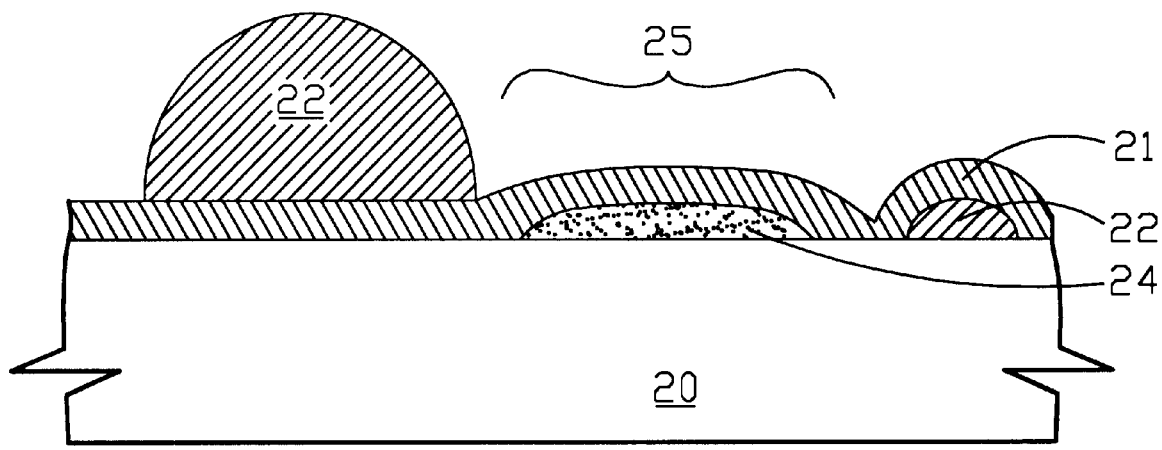

Indisputably, whenever previous monitor wafer is used to monitor one semiconductor process which can be equal to previous semiconductor process, as shown in FIG. 2E which illustrates a case similar to the case of FIG. 1E, pseudo particles 25 which induced by existence of defects 24 is effectively decreased, and then effect of pseudo particles 25 is effectively reduced or even is effectively eliminated.

Compare this present invention with conventional technologies, although this invention further use chemical mechanical polishing process, this invention still is an effective method with simple processes for this invention can effectively prevent effect of pseudo particles and control cleanness of fabrication. Besides, because that chemical mechanical polishing also remove part of film layer, required period of wet etching of this invention also is shorter than that of conventional technologies.

Note that although previous discussion focuses on monitor wafer which is more necessary to be reclaimed for monitor result of processing results on semiconductor fabrication, application this invention is not limited by monitor wafer but can be used by case that wafer is repeatedly used. Where the only limitation of this invention is that both film layer, or called as thin film, and particles which is formed during processing are removed by both chemical mechanical polishing and wet etching. Further, material of particles could be equal to material of film layer, particles could be by-products of the process, may on the top of the film when the particles are adhered after the deposition of film. Besides, owing to corresponding processed process are variable, available varieties of material of film layer at least includes silicon nitride, silicon dioxide, aluminum oxynitride, aluminum, tungsten, borophosphosilicate glass, tetraethyl-orthosilicate glass, and combination of these elements; available varieties of chemical mechanical polishing at least includes oxide chemical mechanical process, dielectric chemical mechanical polishing process, metal chemical mechanical polishing process, and combination of these elements; available varieties of etch solution of wet etching at last includes hydrofluoric acid, solution of ammonium fluoride, nitric acid, phosphoric acid, sulphuric acid, and combination of these elements. Further, the cleaning process usually is chosen from the group consisting of RCA clean, DI water rinse, wet cleaning process, dry etching process, gas phase cleaning process, and combination of previous elements. Certainly, the invention further includes performing a testing process before chemical mechanical polishing process is performed to measure amount of particles and scale-number relation.

Figure 3:
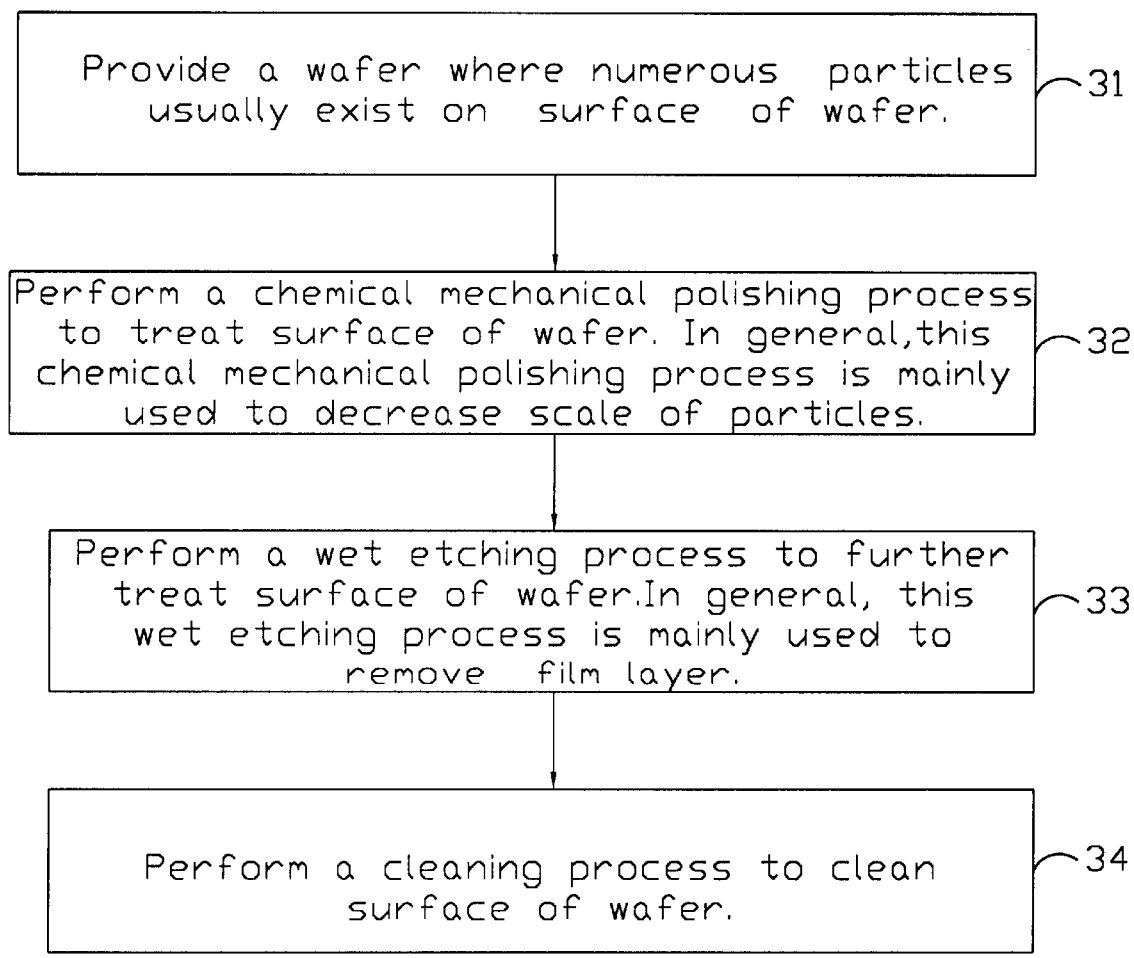
FIG. 3 shows an essential flow-chart of one preferred embodiment of this invention.

Furthermore, because that this invention could remove, at least effectively decrease, particles and thin film, such as film layer, on wafer, this invention also present a wafer for cleaning wafer, include monitor wafer but is not limited to be. As shown in FIG. 3, this method at least includes following steps:

As preparation block 31 shows, provide a wafer. Where numerous particles usually exist on surface of wafer, and particles usually are by-products of processed process, residual particles of processed process or result of pollution of neighboring environment. Moreover, wafer usually is covered by film layer, where part of particles usually are not covered by film layer and film layer is usually made of oxide, nitride, dielectric, metal, and combination of these elements.

As first treatment block 32 shows, perform a chemical mechanical polishing process to treat surface of wafer. In general, this chemical mechanical polishing process is mainly used to decrease the scale of particles.

As second treatment block 33 shows, perform a wet etching process to further treat surface of wafer. In general, this wet etching process is mainly used to remove film layer.

As cleanness block 34 shows, perform a cleaning process to clean surface of wafer. Herein, any well-known cleaning process could be used.

Figure 4:
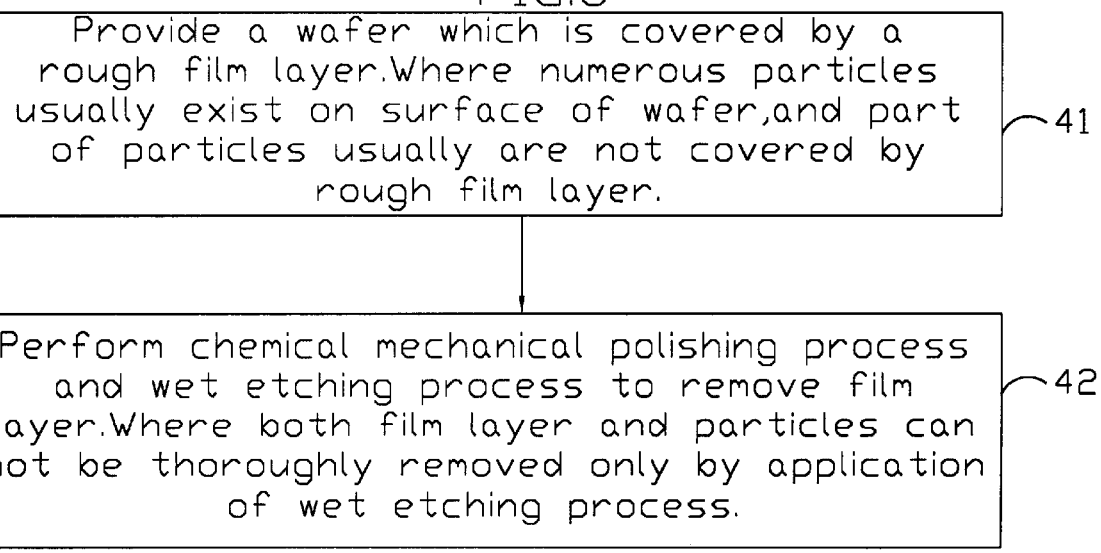
FIG. 4 shows an essential flow-chart of another preferred embodiment of this invention.

Similarly, because this invention could remove, at least effectively decrease, particles and thin film, such as film layer, on wafer, this invention also present a wafer for planarizing wafer, include monitor wafer but is not limited to be. As shown in FIG. 4, this method at least includes following steps:

As preparation block 41 shows, provide a wafer which is covered by a rough film layer. Where numerous particles usually exist on surface of wafer, and part of particles usually are not covered by rough film layer.

As planarization block 42 shows, perform chemical mechanical polishing process and wet etching process to remove film layer. Where both film layer and particles can not be thoroughly removed only by application of wet etching process.

Note that it is allowable to treat film layer only by chemical mechanical polishing without application of wet etching process whenever film layer covers a underlying substrate which could be used as the stop layer of chemical mechanical polishing process. Further, it also is allowable to let part of film layer is removed by chemical mechanical polishing process and residual film layer can be removed by wet etching process whenever film layer covers a underlying layer which could not be used as the stop layer of chemical mechanical polishing process. Moreover, it still is allowable to let part of film layer is removed by chemical mechanical polishing process and residual film layer is removed by wet etching process. Furthermore, it is emphasized that performing order between chemical mechanical polishing process and wet etching process also is exchangeable for all methods present by this invention.

In addition, chemical mechanical polishing process usually is chosen from the group consisting of oxide chemical mechanical process, dielectric chemical mechanical polishing process, metal chemical mechanical polishing process, and combination of previous elements. Etching solution used by wet etching process is chosen from the group of hydrofluoric acid, solution of ammonium fluoride, nitric acid, phosphoric acid, sulphuric acid, and combination of previous elements.

From the foregoing it will be appreciated that, although specific embodiments of the invention have been described herein for purpose of illustration, various modification may, be made without deviating from the spirit and scope of the invention. Accordingly, the invention is not limited except as by the appended claims.

What is claimed is:

1. A method of wafer reclaiming, comprising:
   providing a wafer, said wafer having at least a gas film layer and a plurality of particles formed thereon;
   performing a chemical mechanical polishing process over said wafer, wherein at least a portion of said film layer remains thereon;
   performing a wet etching process to remove said remaining film layer and said particles; and
   performing a cleaning process.

2. The method of claim 1, said film layer and said particles being made of the same material.

3. The method of claim 1, wherein thickness of said film layer is non-uniform before said chemical mechanical polishing process.

4. The method of claim 1, wherein material of said film layer is chosen the group consisting of silicon nitride, silicon dioxide, silicon oxynitride, aluminum, tungsten, borophosphosilicate glass, tetraethyl-orthosilicate glass, and combination of previous elements.

5. The method of claim 1, wherein said chemical mechanical polishing process is chosen from the group consisting of oxide chemical mechanical process, dielectric chemical mechanical polishing process, metal chemical mechanical polishing process, and combination of previous elements.

6. The method of claim 1, the etching solution used by said wet etching process is chosen form the group consisting of hydrofluoric acid, solution of ammonium fluoride, nitric acid, phosphoric acid, sulphuric acid, hydrochloride acid, ammonia hydroxide, and combination of previous elements.

7. The method of claim 1, wherein said cleaning process is chosen from the group consisting of RCA clean, DI water rinse, wet cleaning process, gas phase cleaning process, and combination of previous elements.

8. The method of claim 1, the removed portion of said wafer being negligible.

9. A method for cleaning wafer, comprising:
   providing a wafer, said wafer being covered by an non-uniform layer;
   performing a chemical mechanical polishing process, wherein at least a portion of said non-uniform layer remains thereon;
   performing a wet etching process to remove remaining said non-uniform layer; and
   performing a cleaning process on said wafer.

10. The method of claim 9, wherein a plurality of particles are existent in and on said non-uniform layer.

11. The method of claim 9, wherein said particles are chosen form the group consisting of by-products of previously performed semiconductor process, residual particles of previously performed semiconductor process, pollution induced by environment, and combination of previous elements.

12. The method of claim 9, wherein said non-uniform layer is chosen form the group consisting of oxide, nitride, dielectric, metal, and combination of previous elements.

13. The method of claim 9, wherein said chemical mechanical polishing process is chosen form the group consisting of oxide chemical metal polishing process, dielectric chemical mechanical polishing process, metal chemical mechanical polishing process, and combination of previous elements.

14. The method of claim 9, the etching solution used by said wet etching process is chosen form the group consisting of hydrofluoric acid, solution of ammonium fluoride, nitric acid, phosphoric acid, sulphuric acid, hydrochloride acid, ammonia hydroxide, and combination of previous elements.

15. The method of claim 9, wherein said cleaning process is chosen from the group consisting of RCA clean, DI water rinse, wet cleaning process, gas phase cleaning process, and combination of previous elements.

16. The method of claim 9, the removed portion of said wafer being negligible.

* * * * *